United States Patent [19]

Maelzer et al.

[11] Patent Number: 4,788,496
[45] Date of Patent: Nov. 29, 1988

[54] ADAPTER FOR A PRINTED CIRCUIT BOARD TESTING DEVICE

[75] Inventors: Martin Maelzer; Erich Luther, both of Hagenburgerstrasse 26, 3050 Wunstorf, Fed. Rep. of Germany; Ruediger Dehmel, Wunstorf; Hans H. Higgen, Stadthagen, both of Fed. Rep. of Germany

[73] Assignees: Martin Maelzer; Erich Luther, both of Wunstorf, Fed. Rep. of Germany

[21] Appl. No.: 132,669

[22] Filed: Dec. 10, 1987

Related U.S. Application Data

[63] Continuation of Ser. No. 661,182, Oct. 15, 1984, abandoned.

[30] Foreign Application Priority Data

Nov. 4, 1983 [EP] European Pat. Off. ........ 83111038.2
Nov. 7, 1983 [DE] Fed. Rep. of Germany ....... 3340184

[51] Int. Cl.⁴ .................... G01R 31/02; G01R 1/06
[52] U.S. Cl. .............. 324/158 F; 324/73 PC; 324/158 P
[58] Field of Search .......... 324/158 F, 158 P, 73 PC, 324/72.5

[56] References Cited

U.S. PATENT DOCUMENTS

| | | | |
|---|---|---|---|
| 3,848,188 | 11/1974 | Ardezzone | 324/73 AT |
| 4,164,704 | 8/1979 | Kato et al. | 324/73 PC |
| 4,423,376 | 12/1983 | Byrnes et al. | 324/158 F |
| 4,535,536 | 8/1985 | Wyss | 324/73 PC |
| 4,622,514 | 11/1986 | Lewis | 324/158 P |
| 4,686,467 | 8/1987 | De Lapp et al. | 324/158 |

FOREIGN PATENT DOCUMENTS

| | | | |
|---|---|---|---|
| 10050913 | 5/1982 | European Pat. Off. | |
| 2933862 | 3/1981 | Fed. Rep. of Germany | 324/73 PC |
| 49270 | 3/1985 | Japan | |
| 2146849 | 4/1985 | United Kingdom | |

OTHER PUBLICATIONS

Mania Brochure "Universalgrund Adapter System", Mania GmbH, Haupstrasse 86, D-6384 Schmitten 2, W. Germany, pp. 1-7.

*Primary Examiner*—Ernest F. Karlsen
*Attorney, Agent, or Firm*—Fitzpatrick, Cella, Harper & Scinto

[57] ABSTRACT

An adapter (13) for a printed circuit board testing device (6), by means of which test contacts, (7) which are located in a grid, may be connected with test points (3), which are located in and/or beyond the grid, on a printed circuit board (2), which is to be tested, the connection being effected by means of adapter pins (14) which extend through first, second and third guide plates (10, 15 and 16), the third guide plate (16) being arranged between the first and second guide plates (10 and 15). The third guide plate (16) is arranged to be shifted square to the first and second guide plates (10 and 15) and guide holes (20) in the third guide plate (16) are provided at all points of the grid. The holes (20) have a diameter which tolerates a limited amount of clearance for steering of the adapter pins (14) in these guide holes (20).

6 Claims, 13 Drawing Sheets

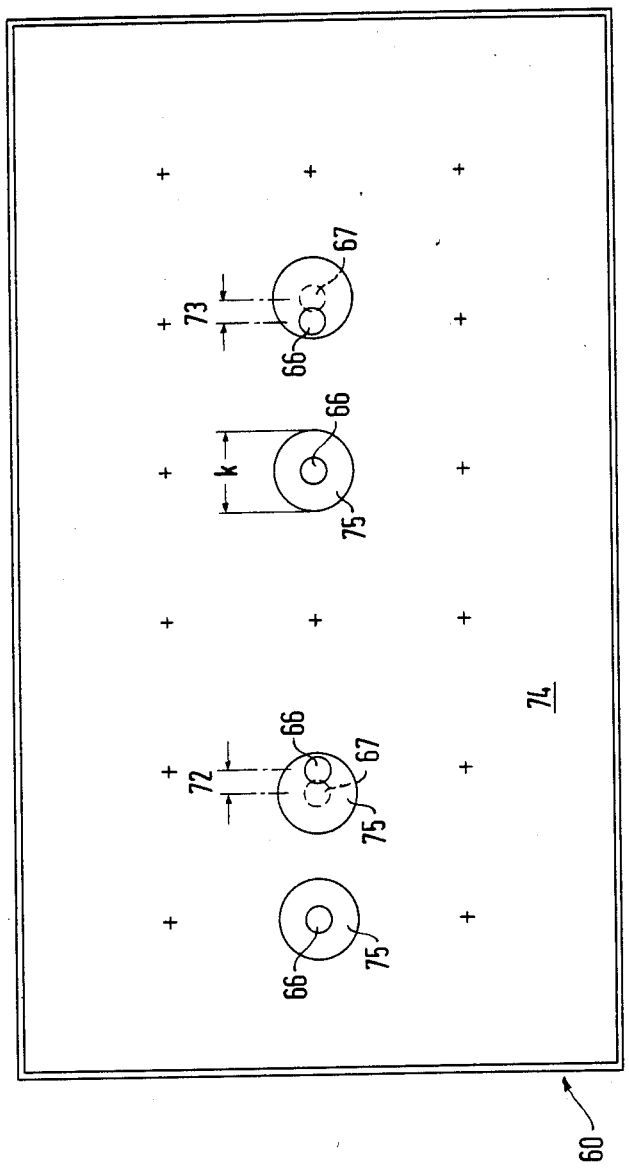

ADAPTER FOR A PRINTED CIRCUIT BOARD TESTING DEVICE

This application is a continuation of application Ser. No. 661,182, filed Oct. 15, 1984 (now abandoned).

BACKGROUND OF THE INVENTION

1. Field of the Invention

This invention relates to printed circuit board testing devices and is particular it concerns novel adapters for printed circuit board testing devices and novel methods for loading and unloading adapters for printed circuit board testing devices.

2. Description of the Prior Art

European Patent Application No. 0026824 discloses an adapter for a printed circuit board testing device and which is provided with adapter pins which are set through the adapter for the purpose of connecting test points on a printed circuit board with assigned test contacts arranged in a grid on the testing device so that the test points, which are arranged beyond the grid, become matched to the test contacts arranged in the grid. In the case of a so-called loaded adapter, the adapter pins are set through guide plates having guide holes, which are arranged in and beyond the grid, in order to be supported. When loading the adapter, it is thus necessary to insert the adapter pins into guide holes which are not in alignment with each other. In tne case of the known adapter, insertion in predetermined positions is uncertain even when the insertion is carefully carried out, a process which thus necessitates manual operation, because the extent of deflection of the adapter pins cannot be controlled.

SUMMARY OF THE INVENTION

The present invention overcomes these problems of the prior art and makes possible a more simplified adaptor loading and unloading.

According to one aspect of the invention there is provided a novel adapter for a printed circuit board testing device, having test contacts in the grid thereof which may be connected with test points located in and/or beyond the grid of a printed circuit board to be tested. This connection is achieved by means of adapter pins which extend through guide holes in a first guide plate. The guide holes correspond to the pattern of the test points of the printed circuit board which is to be tested. The adapter also includes a second guide plate, which is arranged at a distance from and parallel to the first guide plate and which has guide holes for the adapter pins. These guide holes are arranged in the grid. The adapter further includes a third guide plate, which is arranged parallel to and between the first and second guide plates and which is also provided with guide holes for the adapter pins. The end region of the adapter pins, which are to be superimposed on the test points of the printed circuit board, extend through the guide holes in the first guide plate. The novel adapter is characterised in that the third guide plate may be shifted square to the first and second guide plates and the guide holes of the third guide plate are provided at each of the points of the grid and have a diameter which tolerates a limited amount of clearance for steering of the adapter pins in the guide holes.

Because of the given clearance with which the adapter pins are set through the third guide plate and because of the shifting of the third guide plate it is possible to steer the adapter pins to-and-fro, in which case the width of deflection is given by the clearance and may be increased by shifting the third guide plate. Each adapter pin can be inserted into the guide hole which lies closest to it much more easily on account of this novel arrangement. This novel arrangement also makes possible mechanical insertion of the adapter pins into the first guide plate (e.g. by lifting of the third guide plate through vibration) or even semi or fully automatic loading on account of the controllable deflection of the adapter pins.

In a preferred arrangement the third guide plate is fixed in position, which in each case is slightly longitudinally advanced relative to the adapter pins. This accomodates the inevitable difference in height between the test contacts and test points during operation. Otherwise, if the third guide plate were brought back again, then points of friction would develop for the contact pins, which are not in aligment with the grid.

It is also preferred to provide for removal and replacement of the first guideplate so that the adapter may be unloaded.

It is also preferred to provide at least one stop for the lower end of lift position of the third guide plate, so that it may be held in this position irrespective of the drive.

The invention also relates to a method for loading the adapter. According to this method the adapter is aligned underneath the adapter pins, which are arranged to be suspended of the adapter are arranged in an essentially horizontal manner and the first guide plate is located at the bottom. The adapter pins are inserted from above into the guide holes of the second and third guide plates in which case the adapter pins extend, if necessary, into guide holes arranged in a grid in the first guide plate. The third guide plate is moved upwards out of a lower starting position through vibration; and the adapter pins which extend adjacent the guide holes beyond the grid of the first guide plate are induced to deflect in a varying manner with an increasing width of deflection and extend into the appropriate guide holes in the first guide plate which are respectively assigned to them.

With the method according to the invention an adapter can be loaded not only in a simple manner, but also by mechanically carrying out at least the step of the method—insertion with vibration—or it may even be loaded fully automatically. The insertion of the adapter pins into a guide with given radial clearance of motion, and the progressive increase in the effective clearance of motion on account of the shifting of this guide, are of special significance. The adapter pins can steer to-and-fro radially, that is, about the guide point in the second guide plate, which, as it were, forms a spacial steering point, on account of the given radial clearance of motion. Through the application of vibration, the adapter pins steer to-and-fro very quickly, their points brushing over surfaces. The closer the third guide plate is advanced to the aforementioned steering point, the greater is the width of deflection at the points. On the basis of the method according to the invention, the adapter pins are caused to find in each case that guide hole which is nearest in the first guide plate, into which hole they then enter.

In carrying out the method of this invention it is preferred that when the pins are inserted into the first guide plate they are oscillated simultaneously to avoid interference with their oscillation.

On account of the increased amplitude of oscillation, it is preferred to have the adapter pins to which no guide hole is assigned assume an inclined position and remain in this position. As the ends of the adapter pins which are to be gripped by the holding device take part in the swinging movement and also stand so that they are inclined, the adapter pin ends are placed in readiness in a central position.

It is also preferred to draw the adapter pins to which no guide hole is assigned in the first guide plate back out of the adapter. It would be possible for these adapter pins to remain in the adapter; however, this would require special measures to be taken in order to avoid harm caused by the ends of the adapter pins projecting further out of the adapter.

Mechanical loading of the adapter may be linked with a machine having moveable component parts. A method according to this invention may be advantegeously carried out in association with such machine because the motive drives for the adapter can be arranged, for example, underneath the machine, in such a way that the range of vision in the region of the adapter during loading, and thus the visual monitoring of the running of the method are unaffected.

The method of the invention is also efficiently carried out by inserting all the adapter pins into the adapter at the same time.

This invention in a further aspect also relates to a method for unloading an adapter. Like the loading method this method also includes simple method steps which render possible trouble-free functioning, even when the steps of the method are carried out mechanically. The method also makes it possible for the adapter pins, to which no guide holes were assigned when loading and which were drawn out again, to be then left in the holding device, to be included in the unloading process and to be placed in readiness agiin in the holding device, if the adapter, which is to be unloaded, is the adapter which has been loaded before or is a similar adapter. This method also may advantageously carried out in association with an unloading machine in such a way that the range of vision in the region of the adapter during unloading, and thus the visual monitoring of the running of the method, are unaffected.

The invention in a still further aspect involves a novel apparatus for loading an adapter, which apparatus is constructed in a simple manner and includes a support which carries the adapter as well as a holding device for the adapter pins, in which case one of these portions, preferably the support, may be shifted, more particularly vertically, in the direction of the other portion. There is also provided a vibrator, which preferably acts on the third guide plate and causes the rapid to-and-fro steering movement of the adapter pins when loading.

In addition to the aforementioned action of facilitating the insertion of tne adapter pins, the aligning apparatus according to the invention in a preferred embodiment, makes it possible to align the adapter pin heads which are formed by the thickened areas, that is, the heads of the adapter pins to which no guide hole is assigned in the third guide plate and which can therefore remain standing in an inclined manner after the step of insertion of the pins into the first guide plate has been carried out with simultaneous oscillation of the adapter pins. In addition, the aligning apparatus can also perform a directing action when inserting the adapter pins into the adapter.

In a preferred construction of the invention it is possible to push the adapter pins, for the purpose of drawing then out, so far out of the adapter that the adapter pin heads can be gripped securely by the holding device.

The invention also makes possible the provision of a built in simple and compact holding device which can exert a clamping effect on the adapter pins.

According to a further feature of the invention cylinder-piston drives having known advantages are provided for shifting the support or the holding device, the aligning apparatus the pin lifting plate and the clamping plate.

For the purposes of the automatic operation, apparatus according to the invention preferably comprises a compressed-air source and an electro-mechanical control unit for the control of the cylinder-piston drives and of the vibrator.

The invention in a still further aspect relates to a novel adapter pin for a printed circuit testing board adapter. One end of this pin is thickened in the shape of a head, this end being that which is turned towards the test contact. A development of this kind makes it easy to hold the adapter pin in the holding device. A head-shaped thickenend area presents herewith advantageous support surfaces so that the holding device does not have to exert a particularly large amount of force. A spherical development of the thickened area is advantageous with regard to the steering movements of the adapter pins. In addition, a spherical thickened area presents a good contact surface for test contacts which have cup-shaped recesses.

On account of the longitudinal dimensioning of the shaft of an adapter pin according to a preferred form of the invention both ends of the adapter pin project out of the adapter and form raised parts of material which can be contacted in an advantageous manner.

As the shapes of the test contacts and test points can, in practice, be varied and the adapter pin ends are subject to wear on account of contact with the test contacts and test points, the invention may be carried out by providing adapter pins constructed in such a way as to make it possible to replace worn-out contact ends. Contact ends of differing shape and size or of differing material, are preferred.

It is also preferred that at least the contact regions of the adapter pin be made of gold in view of its good electrical conductivity.

BRIEF DESCRIPTION OF THE DRAWINGS

In the following, two preferred embodiments of the invention are described in detail in connection with the accompanying drawings in which:

FIG. 12 is an enlarged representation of a detail X in FIG. 1;

FIG. 14 is a top view of the adapter of FIG. 13.

DETAILED DESCRIPTION OF THE PREFERRED EMBODIMENTS

Figure 1:
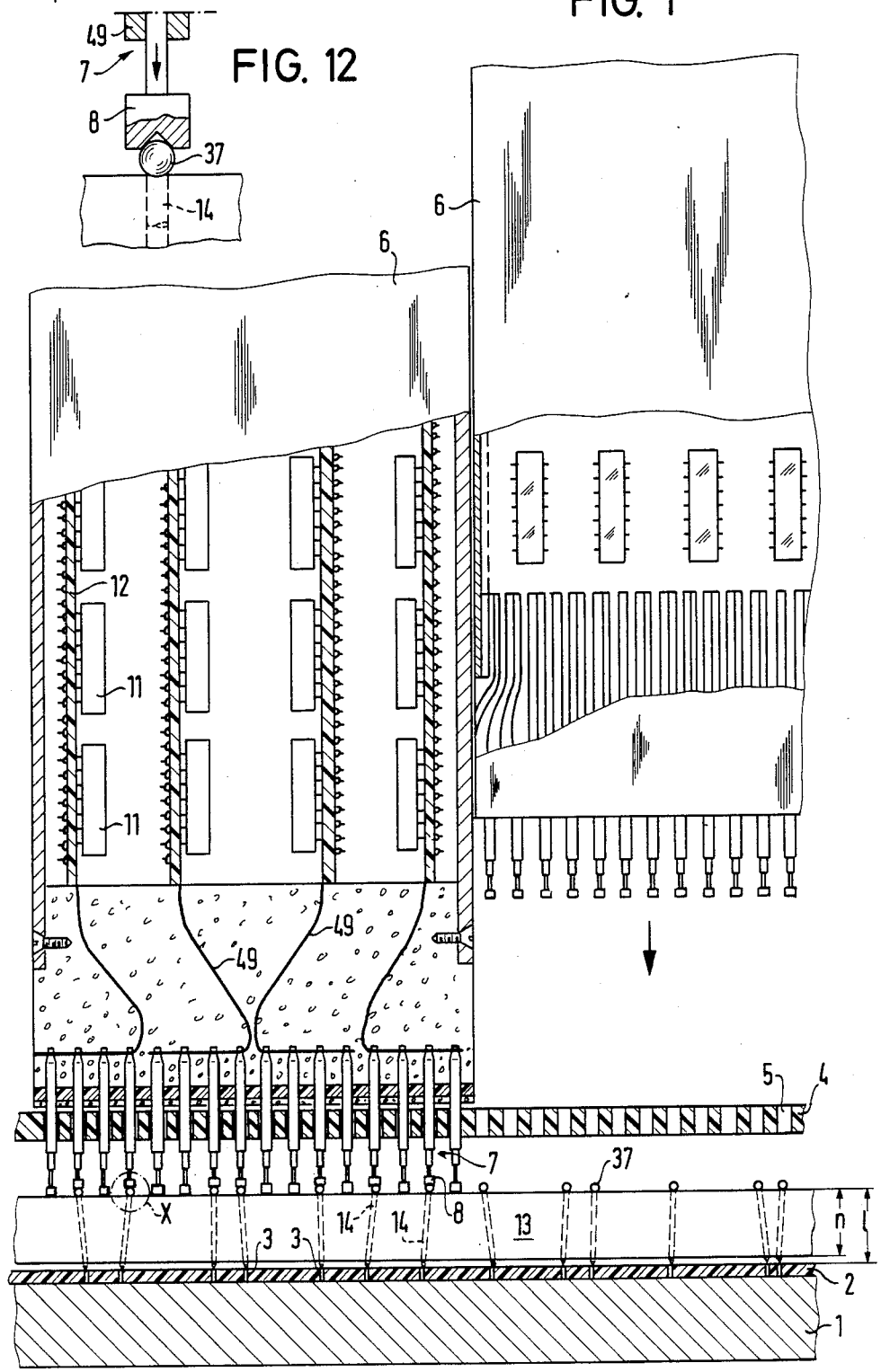
FIG. 1 is a partial section through a device according to the present invention for testing printed circuit boards, wherein the partial section extends square to a printed circuit board contained in the device.

As shown in FIG. 1, there is provided a receiving plate 1 (not represented in full), for testing printed circuit boards. A printed circuit board 2 having test points 3 is positioned on the receiving plate 1. Above the printed circuit board 2, which is to be tested, there are located a perforated grid plate 4, the holes 5 of which are arranged in a grid pattern, and two modules 6, which can be moved in the direction of the printed circuit board 2 and back again. On the lower front sides of the modules 6 there are provided test contacts 7 in the form of pins which penetrate the holes 5 in the perforated grid plate 4 in the position of descent of a module 6. The test contacts 7 contain test contact heads 8 which may be drawn in and out telescopically and which are prestressed in the direction of their outer final position by means of a spring which is not shown in the drawing.

The test contacts 7 are secured in the modules 6 by a casting and they are conected by means of electrical lines 49 to printed circuit boards 12. The printed circuit boards 12 have integrated circuit (IC) chips mounted thereon. These chips are arranged within the modules 6; and, together with the printed circuit boards 12, and, if appropriate, further constructional units, form a partical switch matrix which is assigned to the test contacts 7.

A grid-matching adapter 13 is arranged on the printed circuit board 2. The adapter 13 is provided with a large number of adapter pins 14 which extend through it. The adapter pins 14 connect the test contacts 7, which are arranged in a gird formation, with the test points 3, which are arranged beyond the grid. The adapter pins 14 are not, therefore, in respective alignment with the test contacts, but rather they extend obliquely through the adapter 13; in which case both of their ends project out of the adapter 13 and form places of contact which are raised in respect of the upper and lower sides of the adapter.

Figure 2:
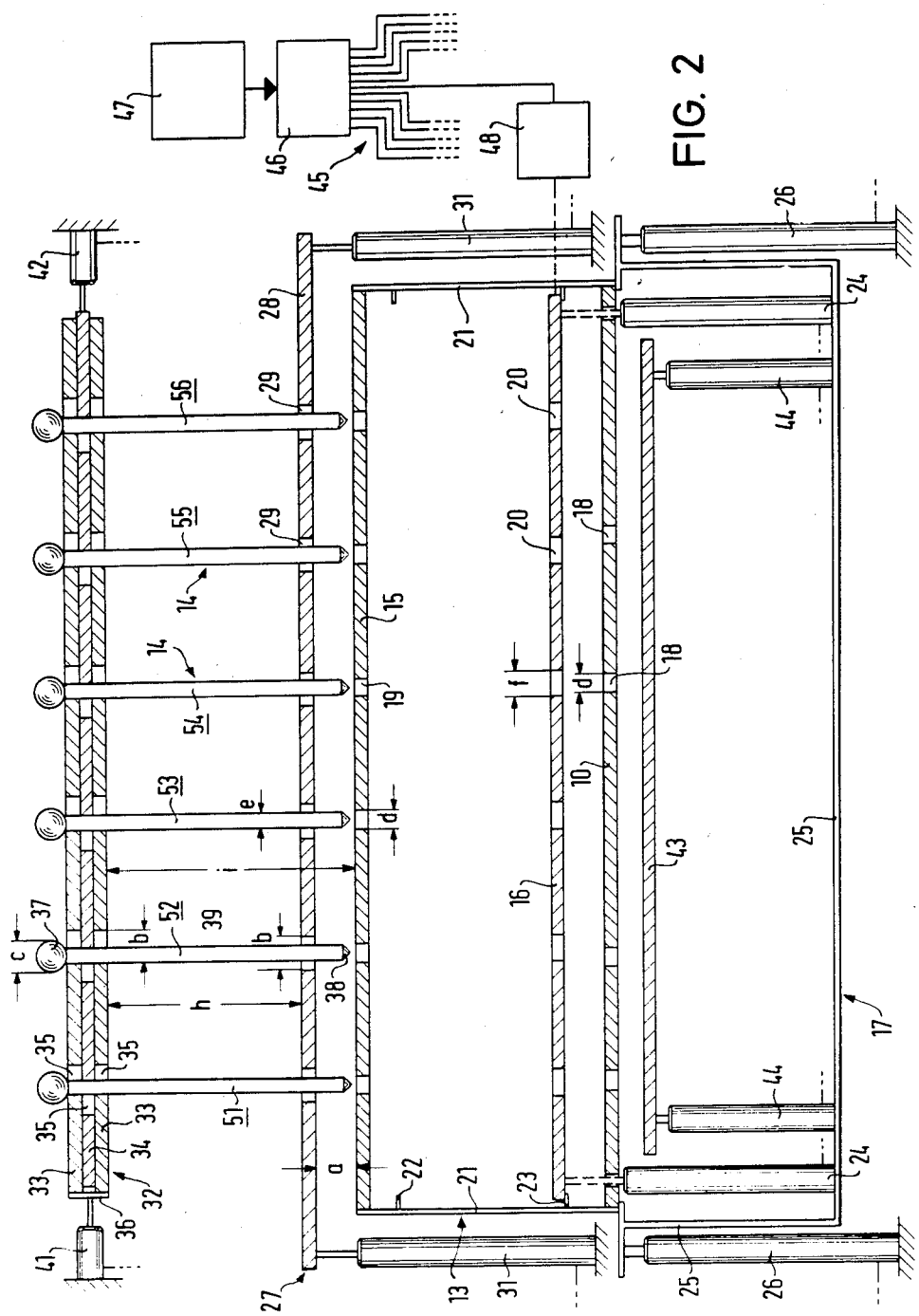
FIG. 2 is a sectional view through an adapter according the present invention and apparatus for loading or unloading the adapter.
Figure 3:
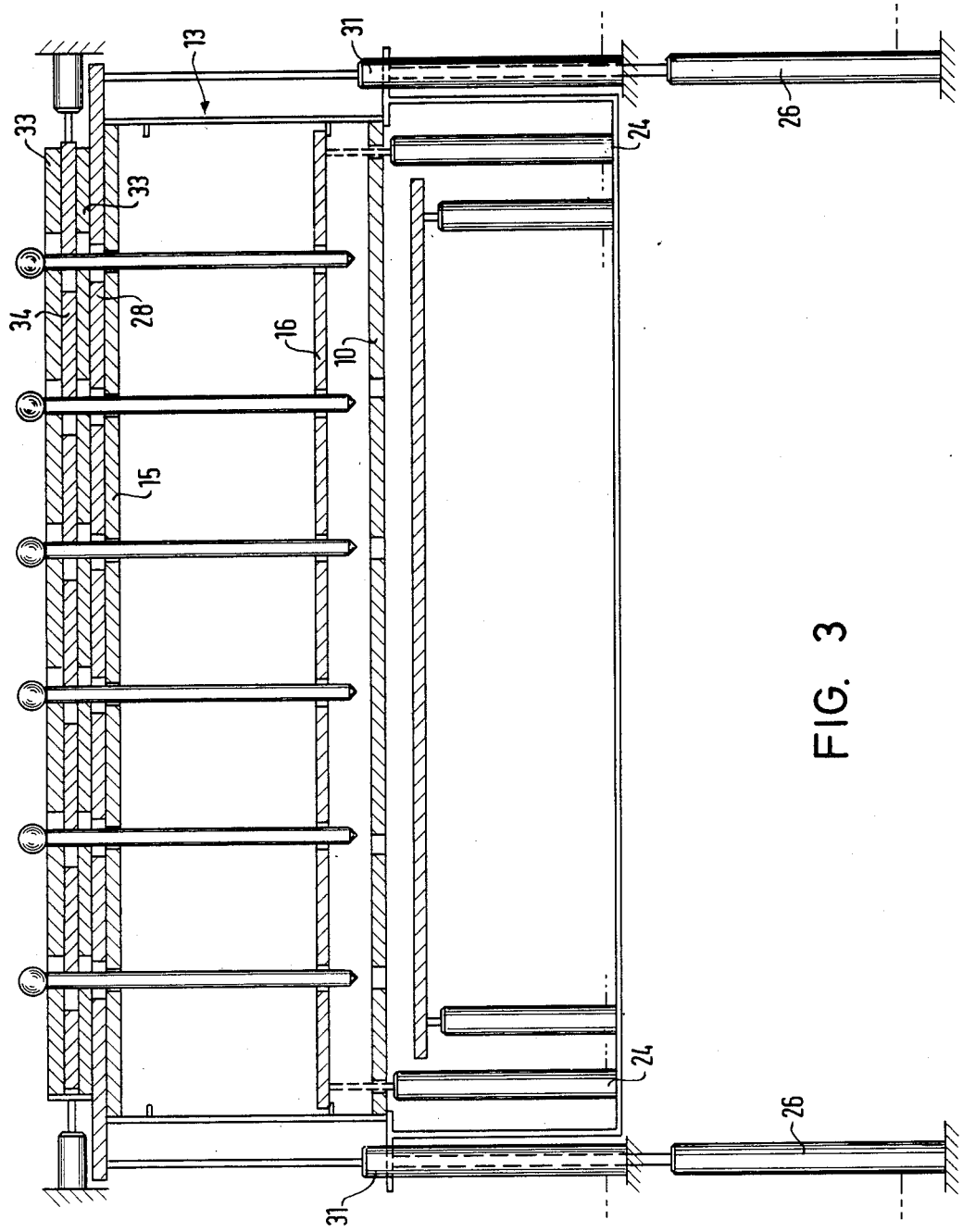
FIGS. 3 to 11 are views similar to FIG. 2 but showing the adapter in various operating positions.
Figure 4:
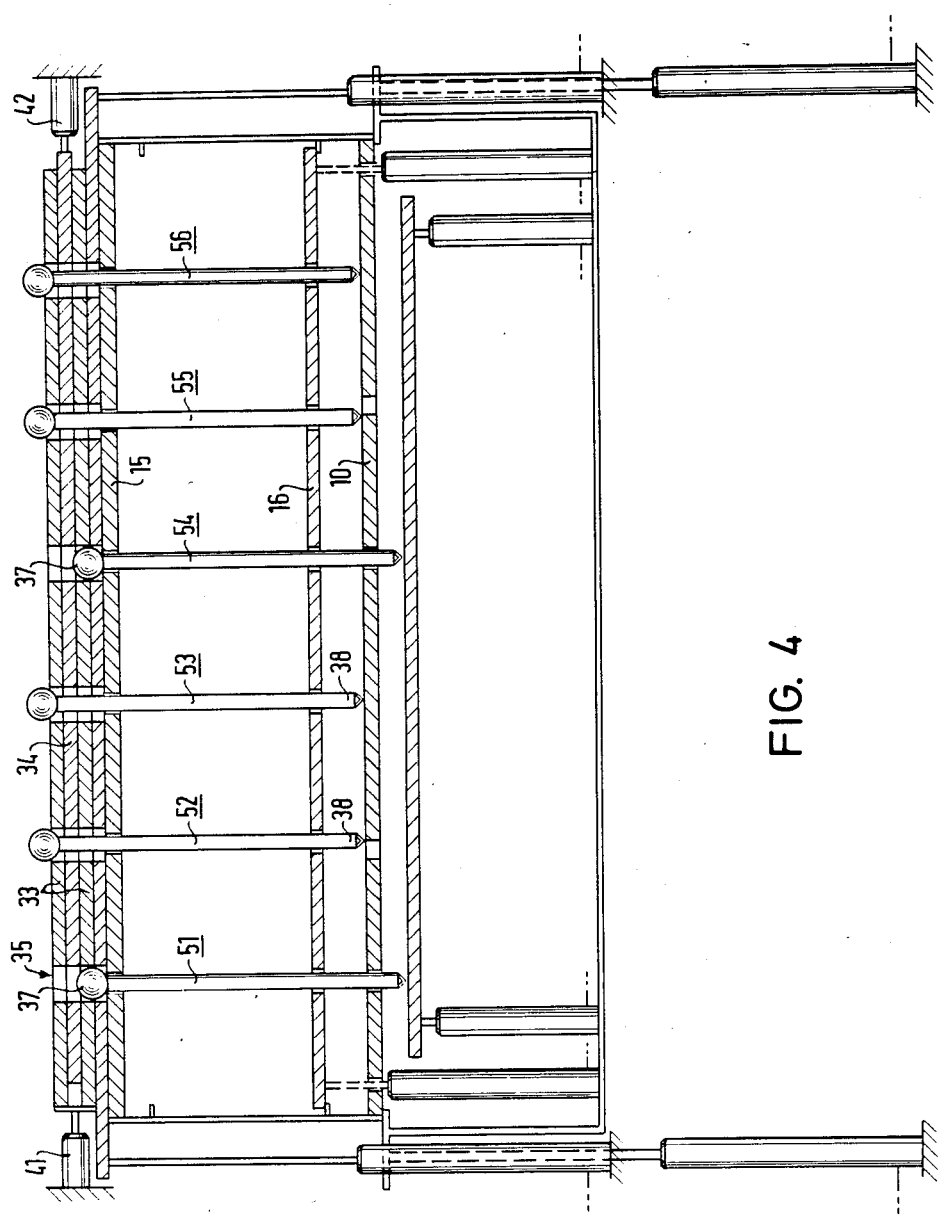
Figure 5:
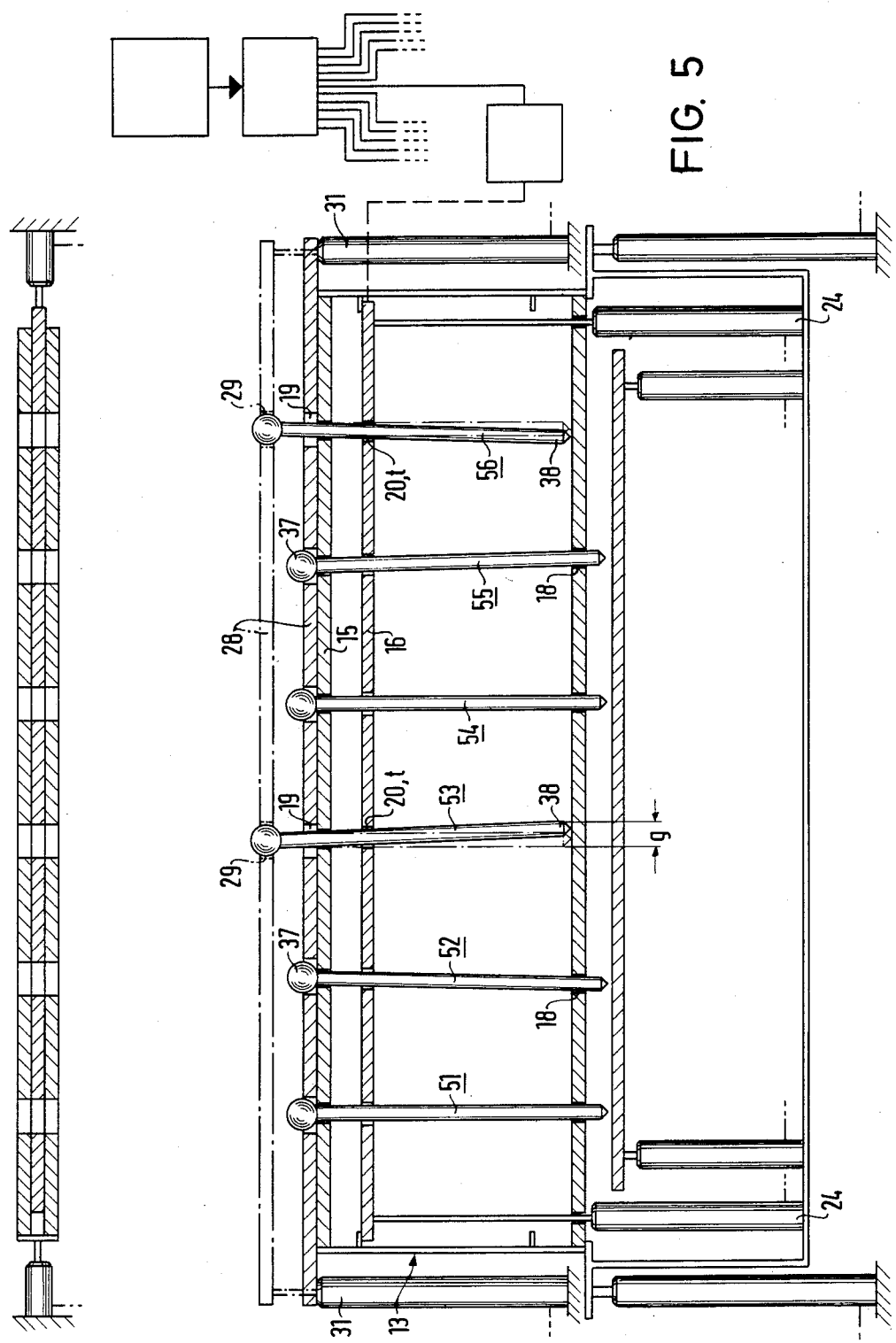
Figure 6:
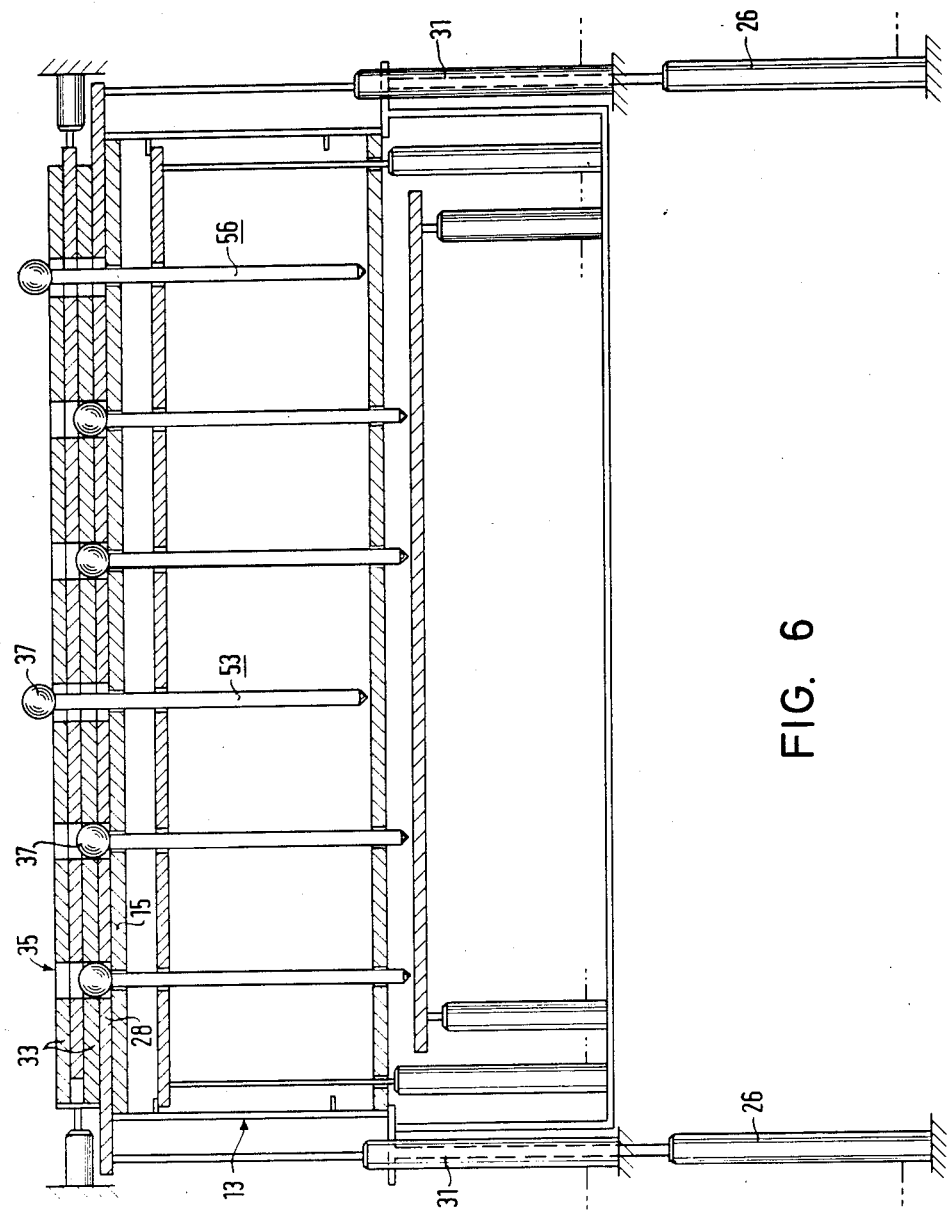
Figure 7:
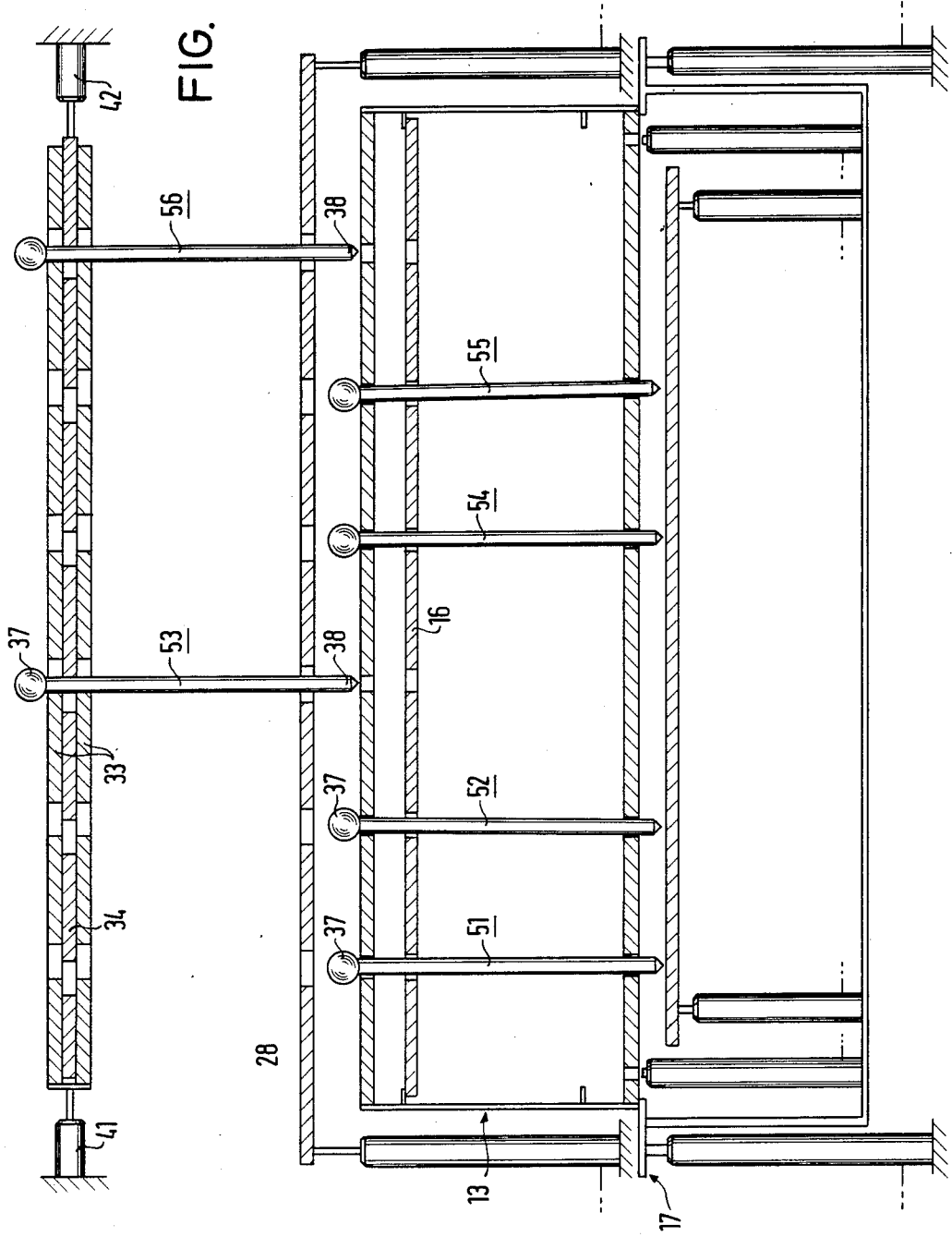
Figure 8:
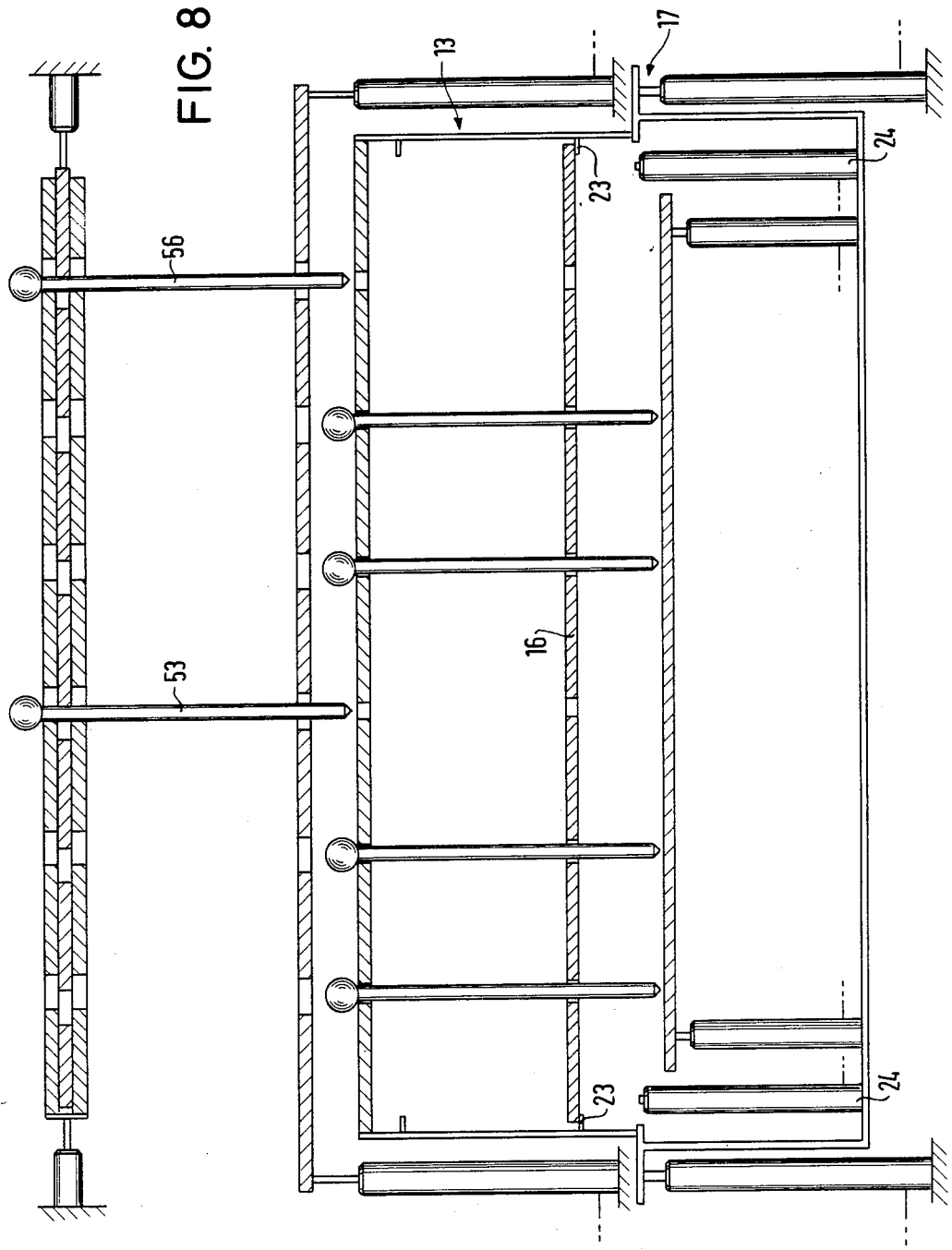
Figure 9:
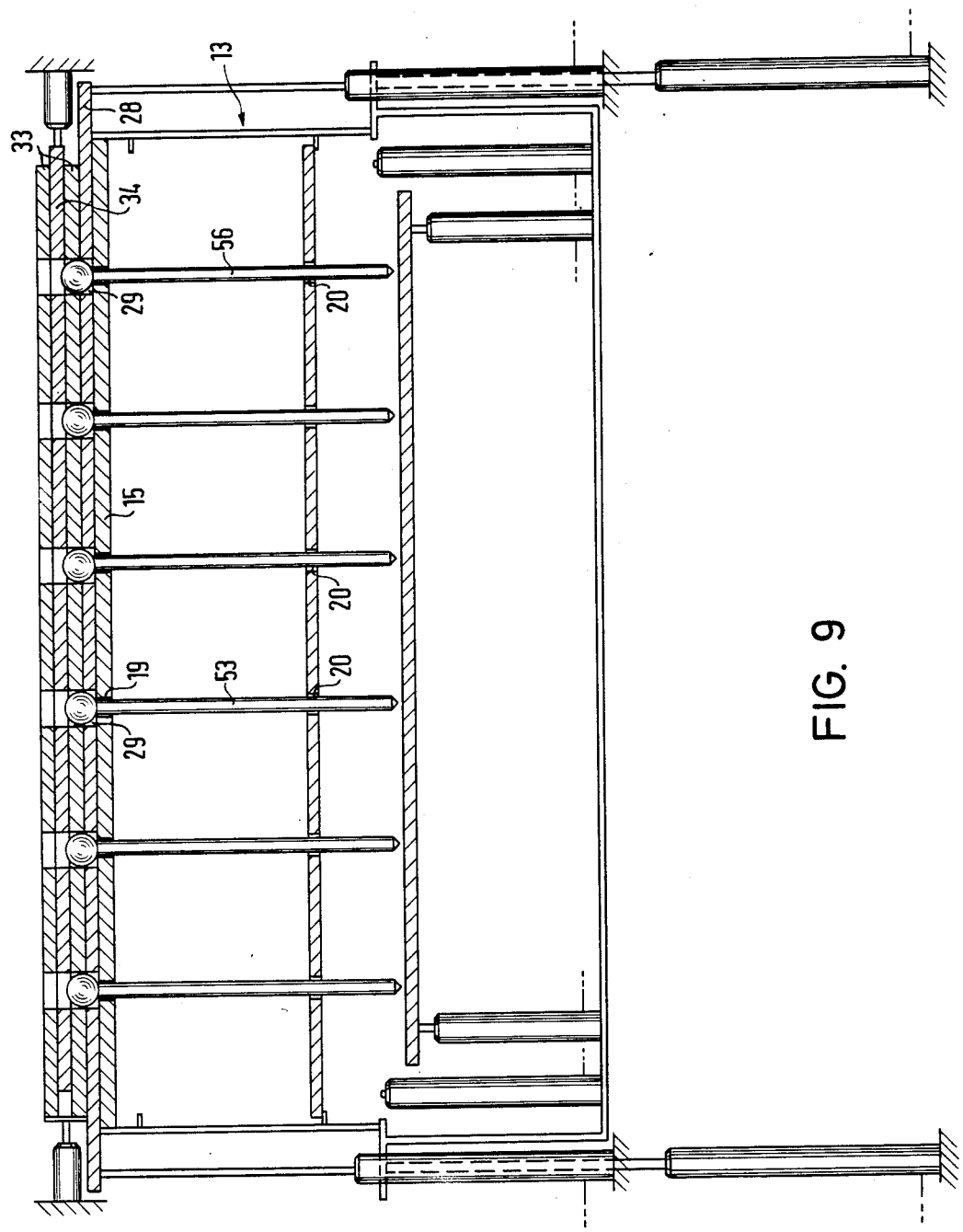

In FIG. 2, the adapter 13 is shown enlarged. In addition, the adapter 13 is also diagrammatically shown in association with a loading or unloading apparatus 17. The adapter 13 has a first horizontal guide plate 10 having guide holes 18 which are arranged beyond the grid, a second horizontal guide plate 15, which extends at a distance from and above the first guide plate and which has guide holes 19, which are arranged in the grid, and a third guide plate 16, which extends between the two aforementioned guide plates and which also has guide holes 20 which are arranged in the grid. All three guide plates 10, 15, 16 are made of a non-conductive material for the purpose of preventing short circuits during the testing of the printed circuit boards. While the first and the second guide plates 10 and 15 are rigidly connected with lateral front walls 21 to form a box, the third guide plate 16 may be shifted vertically between upper and lower stops 22, 23 by means of pneumatic cylinder-piston drives 24.

The adapter 13 stands on a support 25 which is constructed in the form of a trough. The support 25 may be shifted vertically by means of two cylinder-piston drives 26. The suport 25 also forms an abutment for the two cylinder-piston drives 24, which in turn are arranged to shift the third guide plate 16.

An aligning apparatus 27 is provided for the adapter pins 14, which are to be inserted into the adapter 13 in a manner described below. The aligning apparatus 27, which extends at a distance from and above the second guide plate, comprises an aligning plate 28 having guide holes 29, which are arranged in the grid, and two cylinder-piston drives 31, which are arranged to shift the aligning plate 30 vertically.

At a distance from and above the aligning apparatus 27, there is provided a holding device 32 for the adapter pins 14. The holding device 32 comprises three clamping plates 33, 34 lying on top of each other and having (when in their open position) holes 35 arranged in the grid. The holding device 32 further comprises two cylinder-piston drives 41, 42. The cylinder-piston drive 41 acts on both clamping plates 33 at the same time through a T-piece 36; and the cylinder-piston drive 42 acts on the middle clamping plate 34. In the open position of the clamping plates 33 and 34 their holes 35 are positioned in mutual alignment. The diameter (b) of the holes 35 is dimensioned so that it is slightly greater than the diameter (c) of adapter pin heads 37 which are formed by means of spherical thickened areas. In the position shown in FIG. 2, the clamping plates 33 and 34 are set in their clamping position wherein they grip the adapter pin heads 37 from below. The clamping plates 33 and 34 are arranged at such distances (h and i) above the aligning plate 28 and the adapter 13 that the adapter pin points 38 extend through the aligning plate 28 and stand before the guide holes 19 in the second guide plate 15. The diameter (b) of the guide holes 29 in the aligning plate 28 corresponds to the diameter (b) of the holes 35 in the clamping plates 33 and 34 so that the adapter pins 14, as described below, can be inserted into the adapter 13. While the diameter (d) of the guide holes 18 and 19 in the first and second guide plates 10 and 15 is dimensioned with just the usual clearance for guidance so that it is greater tnan the diameter (e) of the adapter pin shafts 39, the diameter (f) of the guide holes 20 in the third guide plate 16 is dimensioned with evident clearance so that it is larger. A pin-lifting plate 43, which is vertically adjustable by means of cylinder-piston drives 44, is arranged a suitable below the first guide plate 10.

The aforementioned cylinder-piston drives are driven with compressed air and are connected with a compressed air source 47 by means of lines 45 and a control unit 46 which is represented in a simplified manner.

An ultrasonic vibrator 48 is arranged in conjunction with the loading apparatus 17 to transmit vibrations parallel to the plate plane, to the third guide plate 16.

The individual steps of the method for loading and unloading the adapter 13 and also the resulting operating positions of the loading apparatus 17 are described below with reference to FIGS. 2 to 11.

In the first instance, the adapter 13 is inserted into the loading apparatus 17 by means of a sliding carriage which is not shown. The first guide plate 10 touches down on the support 25 of the loading apparatus 17. The adapter pins 51 to 56 are suspended in the clamping plates 33 and 34 which are shifted towards each other (see FIG. 2).

The cylinder-piston drives 26 are actuated and raise the cylinder-piston drives 24 and, with these, the adapter 13. At the same time, the cylinder-piston drives 31, which raise the aligning plate 28, are actuated. The aligning plate 28 is thereby set against the lower clamping plate 33. The adapter 13 is raised so far that the second guide plate 15 is set against the aligning plate 28 (see FIG. 3).

The cylinder-piston drives 41 and 42 are actuated, whereby the holes 35 in the clamping plates 33 and 34 are placed in position so that they are in alignment with each other. The adapter pins 51 to 56 thus fall out of the holes 35. The adapter pins 51 and 54 fall right through so that their heads 37 come to lie upon the second guide plate 15. The adapter pins 52, 53, 55 and 56 meet the first guide plate 10 with their points 38 (see FIG. 4).

The adapter 13 is lowered again into the starting position according to FIG. 2. The aligning plate 28 is lowered so far that it rests upon the second guide plate 15. The vibrator 48, which causes the third guide plate 16 to vibrate and the adapter pins to deflect about their guide points (guide holes 19), is switched on. At the same time, the third guide plate 16 is raised slowly through actuation of the cylinder-piston drives 24. The adapter pins 52, 53, 55 and 56 thereby obtain in the guide holes 20 of the third guide plate 16 more and more clearance space for motion which gives rise to a greater width of deflection. During their deflection, the adapter pins 52 and 55 find their guide holes 18, that is, the adapter pins fall first of all into the guide holes 18 which are nearest and ultimately into those guide holes 18 which are furthest away in the range of deflection. The heads 37 of these adapter pins 52 and 55 then also rest upon the second guide plate 15. The adapter pins 53 and 56 remain with their points 38 resting on the first guide plate 10, as there are no guide holes 18 at the corresponding places. They are positioned, though, in a substantially oblique manner (see FIG. 5).

The aligning plate 28 is subsequently shifted so far upwards through actuation of the cylinder-piston drives 31 that the heads 37 of the adapter pins 53 and 56 are surrounded by the guide holes 29 of the aligning plate 28. In this way, these adapter pins 53 and 56 are moved so that they are straight again (see position of the aligning plate D indicated by a dot-dash line in FIG. 5).

The next step of the operation is carried out with the object of drawing the adapter pins 53 and 56, which have not been completely inserted, out of the adapter. For this purpose, the adapter 13 is moved upwards through actuation of the cylinder-piston drives 26. At the same time, the aligning plate 28 is moved upwards through actuation of the cylinder-piston drives 31. Both movements take place so that the aligning plate 28 is positioned against the lower clamping plate 33 and the second guide plate 15 of the adapter 13 is positioned against the aligning plate 28. The clamping plates 33 and 34 are placed in position in respect of each other in such a way that their holes 35 are in alignment with each other, that is, that the heads 37 of the adapter pins can pass through (see FIG. 6).

In order to pursue the aforementioned aim, the clamping plates 33 and 34 are locked through actuation of the cylinder-piston drives 41 and 42. The adapter 13 and the aligning plate 28 are then lowered back into their starting position. In this position the aligning plate 28 has released the heads 37 of the adapter pins 51, 52, 54 and 55, so that they are located in the adapter 13 and at the same time the aligning plate 28 guides the points 38 of the adapter pins 53 and 56 which are caught in the clamping plates 33 and 34. If need be, at the same time, the third guide plate 16 is fixed in its upper position by means of a mounting support (not shown); and the cylinder-piston drives 24 are actuated in order to draw the pistons of the latter out of the adapter 13. The third guide plate 16 is fixed in the upper final position in order to interfere with a shift of the adapter pins during the adapter's operation not through friction at the edges of the holes of the third guide plate 16, if the latter is in its lower final position. The adapter 13 is now ready for operation and is removed from the loading apparatus 17 by means of the sliding carriage which is not shown (see FIG. 7).

In order to load the adapter 13 again, its first guide plate 10 must, in the first instance, be removed. The adapter 13 is then brought into the loading apparatus 17 again with the sliding carriage, which is not shown; and the third guide plate 16 is released from its fixed position and moved into its lower final position against the lower stops 23 through means which are not shown (see FIG. 8). The means for the aforementioned fixation and for the lowering movement are not essential to the invention and therefore, in order to simplify matters, are not shown.

The adapter 13 and the aligning plate 28 are then raised so far, and at the same time the clamping plates 33 and 34 are opened, that the aligning plate 28 lies against the lower clamping plate 33 and the second guide plate 15 lies against the aligning plate 28. The adapter pins 53 and 55, which are still held by the clamping plates 33 and 34, project, as a result, through the guide holes 29 and 19 and 20 into the adapter 13 (see FIG. 9).

Figure 10:
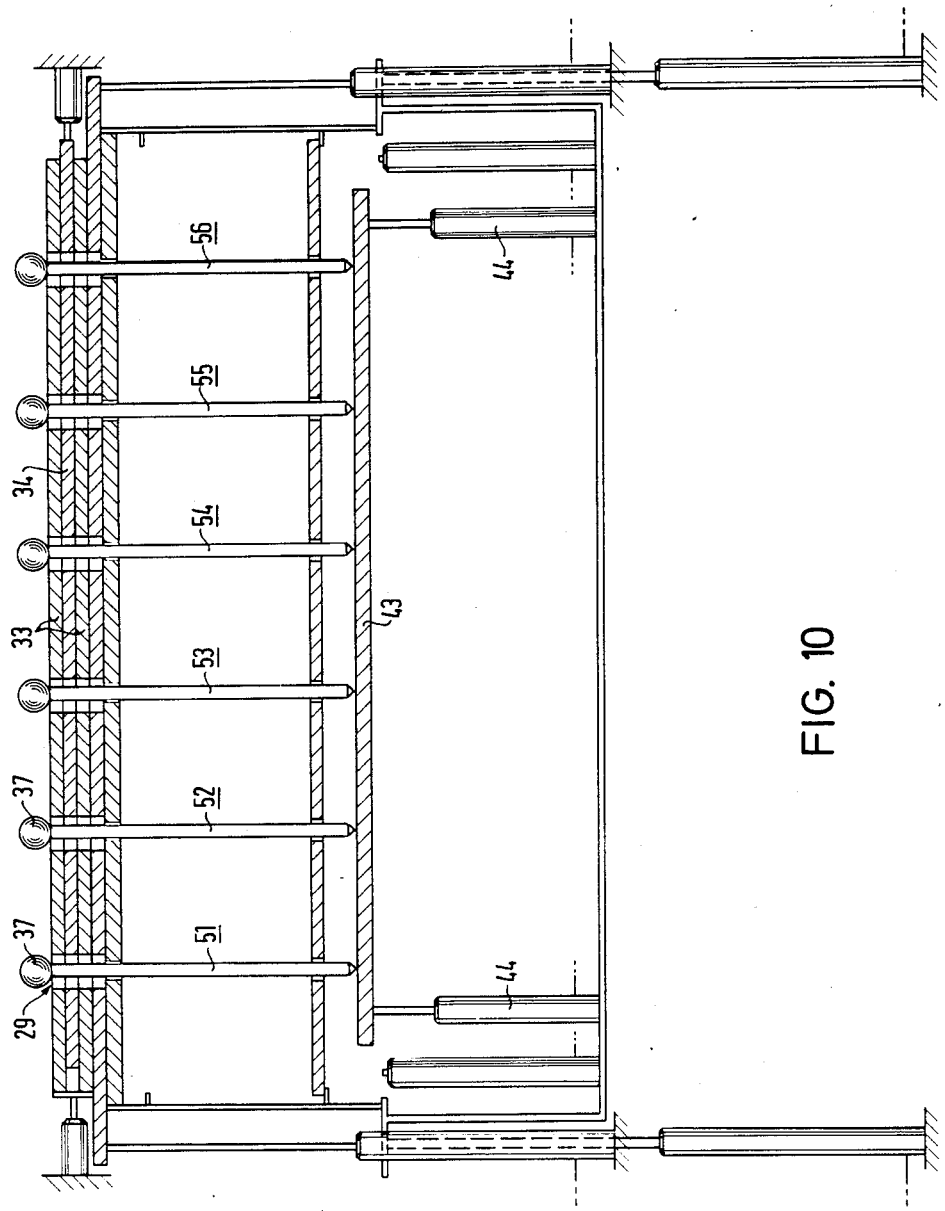

The pin-lifting plate 43 is now shifted upwards through actuation of the cylinder-piston drives 44, whereby the heads 37 of all of the adapter pins 51 to 56 pass through the holes 29 of the clamping plates 33 and 34, which are in alignment, until the heads 37 come to lie above the upper clamping plate 33 (see FIG. 10).

Figure 11:
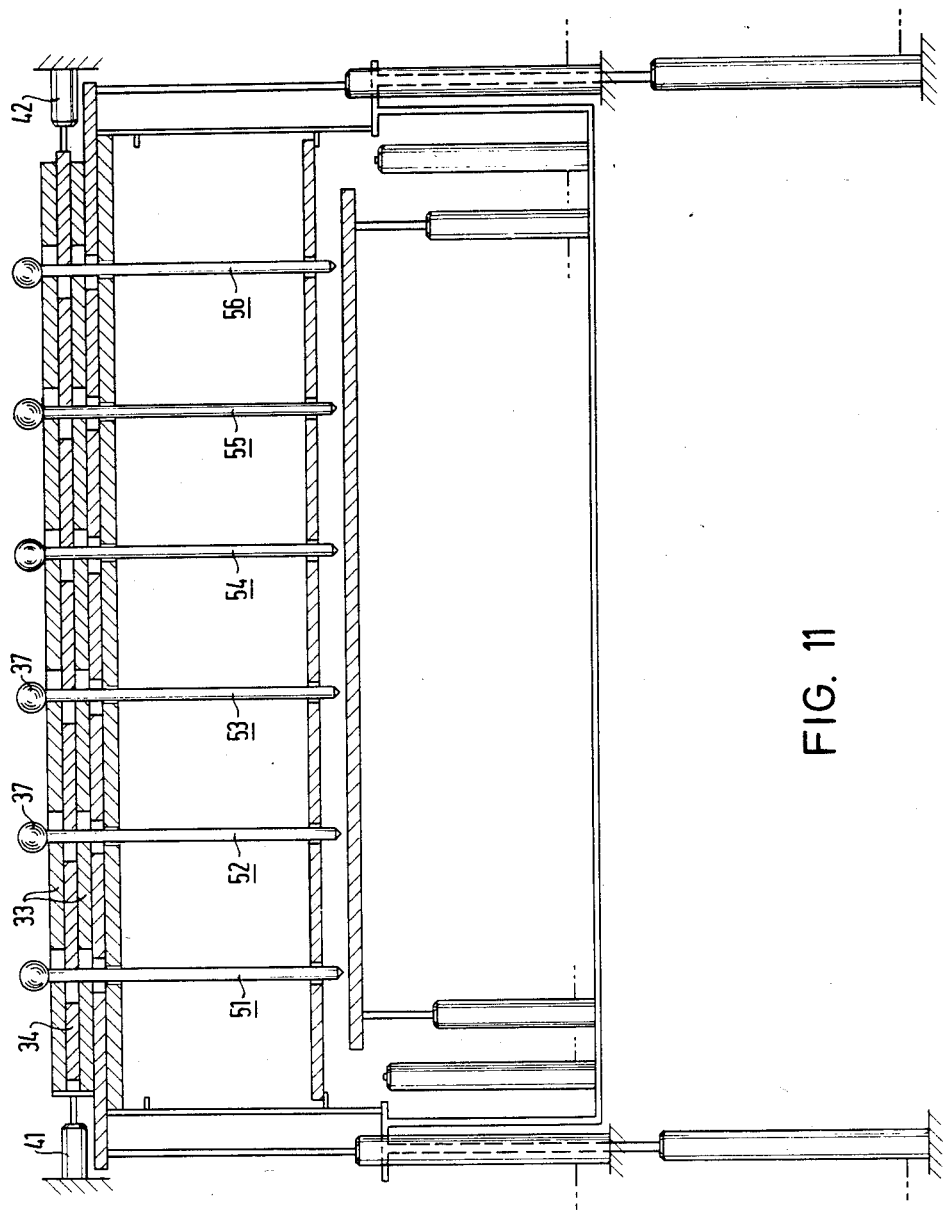

The clamping plates 33 and 34 are now shifted towards each other again through actuation of the cylinder-piston drives 41 and 42 so that all of the adapter pins 51 to 56 are held fast (see FIG. 11).

The last step of the method consists in lowering the pin-lifting plate 43, the adapter 13 and the aligning plate 28 back into the starting position according to FIG. 2. In order to reload the adapter, the latter must again be provided with a first guide plate 10.

In FIG. 12 showing the detail X, there is shown the interaction of the spherical adapter pin heads 37 with the test contacts 7 or their test contact heads 8. The test contact heads 8 are guided in the test contact shaft 49 in such a way that they may be drawn in and out telescopically and are prestressed by means of a spring tension, which is represented as an arrow, in the direction of their extended end of lift position. For the purpose of achieving an improved surface contact with the spherical adapter pin heads, the contact pin heads have cup-shaped recesses on their contact surfaces.

The method covered in the previously described exemplary embodiment and the apparatus for loading the adapter are intended for the fully or semi-automatic loading or unloading operation. This does not, however, preclude a situation where not only one individual step, but also several steps of the method can be carried out manually.

Figure 13:
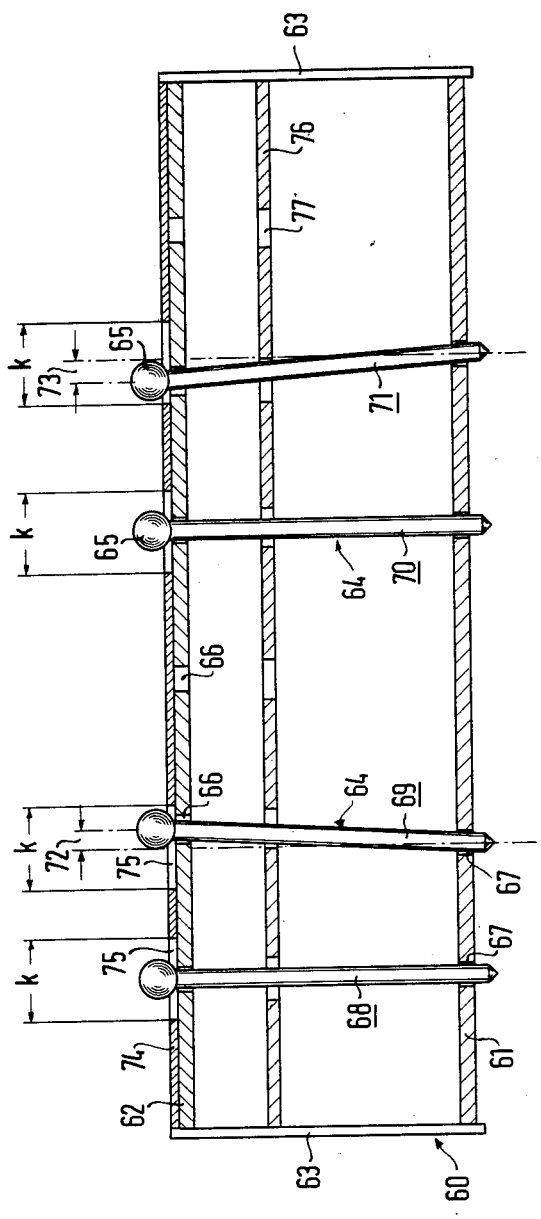
FIG. 13 is a view similar to FIG. 2 showing a second exemplary embodiment of an adapter according to the present invention.

In comparison, the second exemplary embodiment according to FIGS. 12 and 13 relates to an adapter which is intended for manual loading.

This adapter, which in general is denoted with 60, also comprises a first guide plate 61, a second guide plate 62, which is arranged parallel thereto and at a distance therefrom, a front wall 63, which give the adapter 60 the shape of a box, and adapter pins 64, which are set through the adapter 60 suspended from above, in which case they rest upon the second guide plate 62 with spherical heads 65. As in the preceeding embodiment the length of the adapter pins 64 is also dimensioned so that it is greater than the height of the adapter 60 so that the pins form raised places of contact on both sides of the adapter 60.

Also in the case of the second embodiment, the guide holes 66 in the second guide plate 62 are arranged in a grid and the guide holes 67 in the first guide plate 61 are arranged beyond the grid. As can be seen in FIG. 12, the adapter pins 68 and 71 are in alignment with the grid, while the adapter pins 69 and 71 connect places of contact lying in and beyond the grid. The displacement of the places of contact is denoted at 72 in the region of the adapter pin 69 and the displacement in the region of the adapter pin 71 is denoted at 73.

A so-called foil 74 having holes 75, which are arranged beyond the grid and the diameter (k) of which corresponds to twice the sum of the largest possible displacement 72 and 73 and tne radius of the heads 65, lies on the upper side of the second guide plate 62. The foil 74 can thus be removed upwards even after the insertion of the adapter pins 68 to 71.

The purpose of the foil 74 is as follows. For the purpose of loading, the adapter 60 is located in a position as shown in FIG. 13. The operator consequently looks from above at the adapter 60 and sees it in a display, as shown in FIG. 14. It is, of course, not clear from above to which side the guide holes 67 in the first guide plate 61 are displaced in respect of the guide holes 66 in the second guide plate 62. As FIG. 14 clearly shows, the displacement can be easily recognized by the eccentricity, in which state the guide holes 66 in the second guide plate 62 are located inside the holes 75 in the foil 74.

The operator can thus easily see towards which side the guide holes 67 are displaced in the first guide plate 61 and he is able to hold the adapter pins 68 to 71 in a correspondingly oblique manner upon insertion, in order to find the guide holes 67 in the first guide plate 61.

A third guide plate 76, which may be shifted vertically like the third guide plate 16 in the first exemplary embodiment, can also be assigned, in addition, to the adapter 60. Insertion of the adapter pins 68 to 71 can be facilitated further with the aid of the third guide plate 76, because the said pins can be inserted perpendicularly, in which case the adapter pins 68 to 71 are set through guide holes 77 in the third guide plate 76; and, when the adapter pins 69 and 71 stand up on the first guide plate 61, they are deviated towards the eccentricity so that they project into the guide holes 67. The guide holes 77 in the third guide plate 76 are located in the adapter.

We claim:

1. Adapter for a printed circuit board testing device which has test contacts arranged in a grid, and which are to be connected via adapter pins with test points arranged out of grid on a printed circuit board, said adapter comprising a first guide plate provided with adapter pin guide holes, a second guide plate, first support means connected between said first and second guide plates and supporting said second guide plate at a fixed distance above and parallel to the first guide plate, said second guide plate also provided with adapter pin guide holes, the guide holes of one of said guide plates being arranged in a pattern of a grid and the guide holes of the other guide plate being arranged in a pattern out of said grid, a third guide plate provided with adapter pin guide holes arranged according to the pattern of the holes of said second guide plate, second support means connected between said third guide plate and said first and second guide plates to support said third guide plate parallel to and between the first and second guide plates, said guide plates being arranged to accomodate a plurality of adapter pins to extend through the guide holes of said second and third plates, the guide holes in said first and second plates being dimensioned to provide just sufficient clearance for guidance of such adapter pins and the diameter of the guide holes in the third plate being larger than the pin diameter to tolerate a limited amount of clearance for steering the adapter pins to fall into specific guide holes in the first guide plate, said second support means being constructed and arranged to maintain said third guide plate parallel to the first and second guide plates and to shift the third guide plate vertically in a direction from the first guide plate up to the second guide plate while being vibrated, whereby the guide holes of the third plate provide gradually increasing width of deflection so that pins will fall first into the guide holes which are nearest and ultimately fall into those guide holes which are farthest away in range of deflection.

2. Adapter according to claim 1, wherein the third guide plate is arranged to be fixed at an upper position.

3. Adapter according to claim 1, wherein the first guide plate is removeably mounted.

4. Adapter according to claim 1, wherein said third guide plate is arranged to move up and down between said first and second plates and wherein a stop is provided to limit the upward movement of the third guide plate.

5. Adapter according to claim 1, wherein adapter pins extend through the holes in said plates.

6. Adapter according to claim 5, wherein each of said adapter pins has a thickened area at its upper end, said thickened area having a larger diameter than the diameter of the guide holes of said second guide plate for suspension of said guide pins from said second guide plate.

* * * * *